United States Patent
Jerphagnon et al.

(10) Patent No.: US 9,823,156 B1
(45) Date of Patent: Nov. 21, 2017

(54) METHODS TO DETECT WATER LEAKS IN IRRIGATION SYSTEMS USING A PUMP ENERGY CONSUMPTION DATA

(71) Applicant: PowWow Energy Inc., Sunnyvale, CA (US)

(72) Inventors: Olivier Jerphagnon, Foster City, CA (US); Brad Gaiser, Los Altos, CA (US)

(73) Assignee: PowWow Energy, Inc., Sunnyvale, CA (US)

( * ) Notice: Subject to any disclaimer, the term of this patent is extended or adjusted under 35 U.S.C. 154(b) by 644 days.

(21) Appl. No.: 14/506,484

(22) Filed: Oct. 3, 2014

Related U.S. Application Data

(60) Provisional application No. 61/888,459, filed on Oct. 8, 2013.

(51) Int. Cl.
  *G01F 17/00* (2006.01)
  *G01M 3/04* (2006.01)
  *G06F 11/30* (2006.01)

(52) U.S. Cl.
  CPC .................................. *G01M 3/04* (2013.01)

(58) Field of Classification Search
  CPC .................................................... G01R 21/00
  See application file for complete search history.

(56) References Cited

U.S. PATENT DOCUMENTS

| | | | | |
|---|---|---|---|---|
| 2010/0156632 | A1* | 6/2010 | Hyland | G08B 25/08 340/540 |
| 2012/0197552 | A1* | 8/2012 | Robinson | G01D 4/002 702/50 |
| 2013/0334880 | A1* | 12/2013 | Jerphagnon | H02J 4/00 307/23 |

FOREIGN PATENT DOCUMENTS

EP    2562610    2/2013

OTHER PUBLICATIONS

The Energy Services Provider Interface (OpenESPI) website/ screenshot, downloaded Oct. 14, 2014, 1 page.

* cited by examiner

*Primary Examiner* — Phuong Huynh
(74) *Attorney, Agent, or Firm* — Pillsbury Winthrop Shaw Pittman LLP

(57) ABSTRACT

Water leaks in irrigation systems may be detected by analysis of water pump energy consumption data captured from a utility power meter. Unlike existing solutions that use water meters or acoustic sensors, embodiments of the present apparatus and methods described herein detect water leaks based upon the electrical load associated with the water pump(s) in irrigation lines. These methods have the advantage of not requiring any extra hardware at the site of the irrigation system.

20 Claims, 16 Drawing Sheets

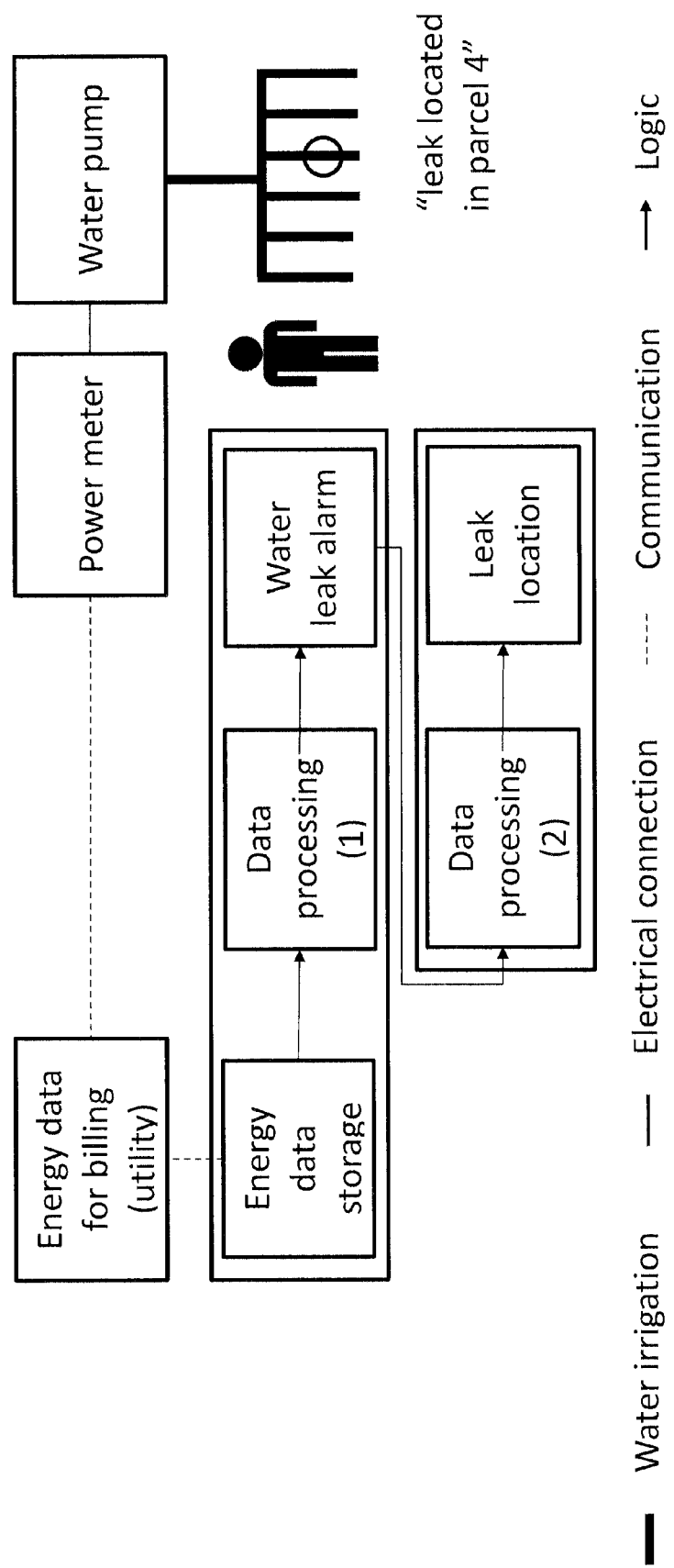
FIG. 7-A

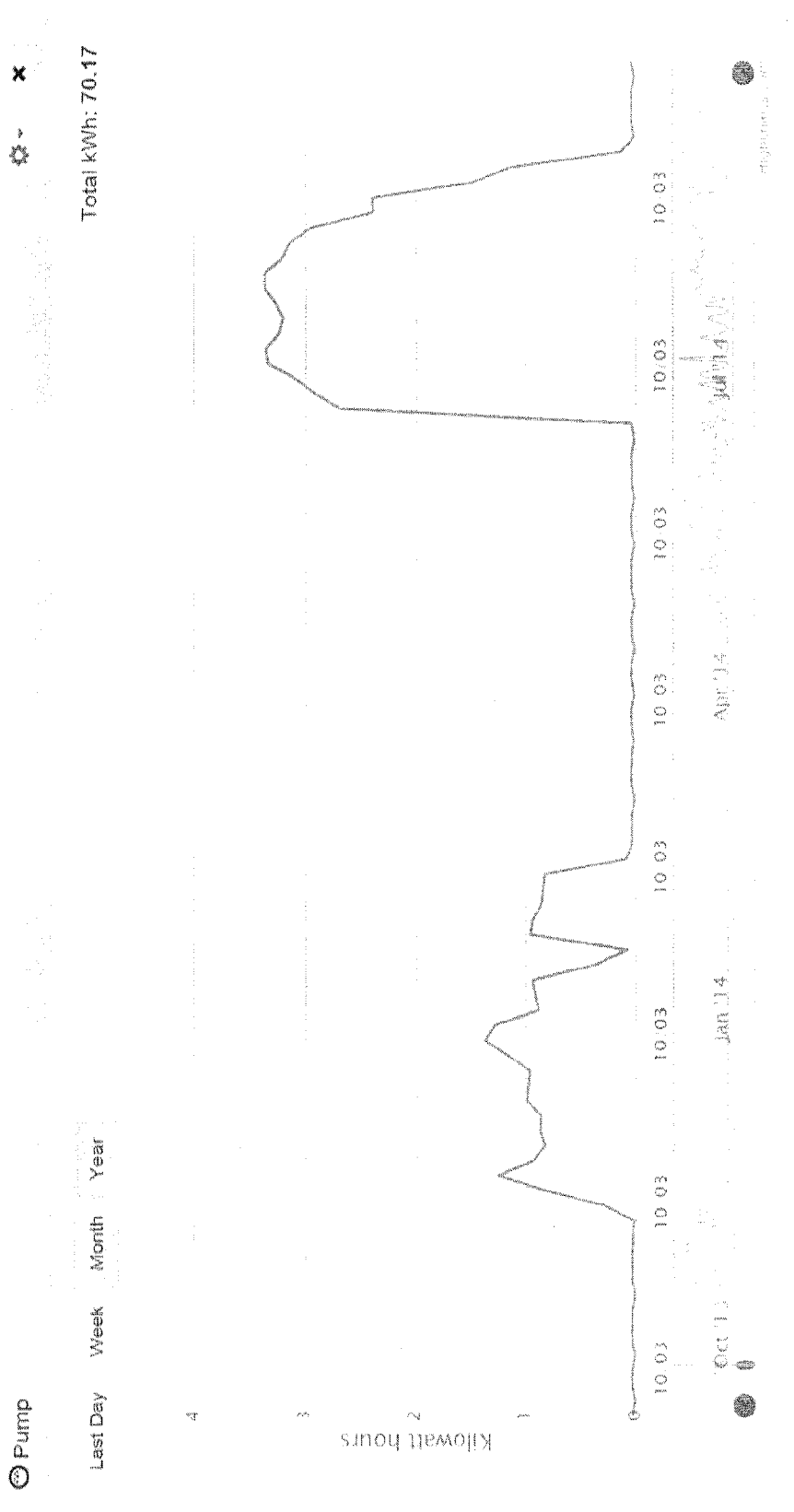
FIG. 7-B

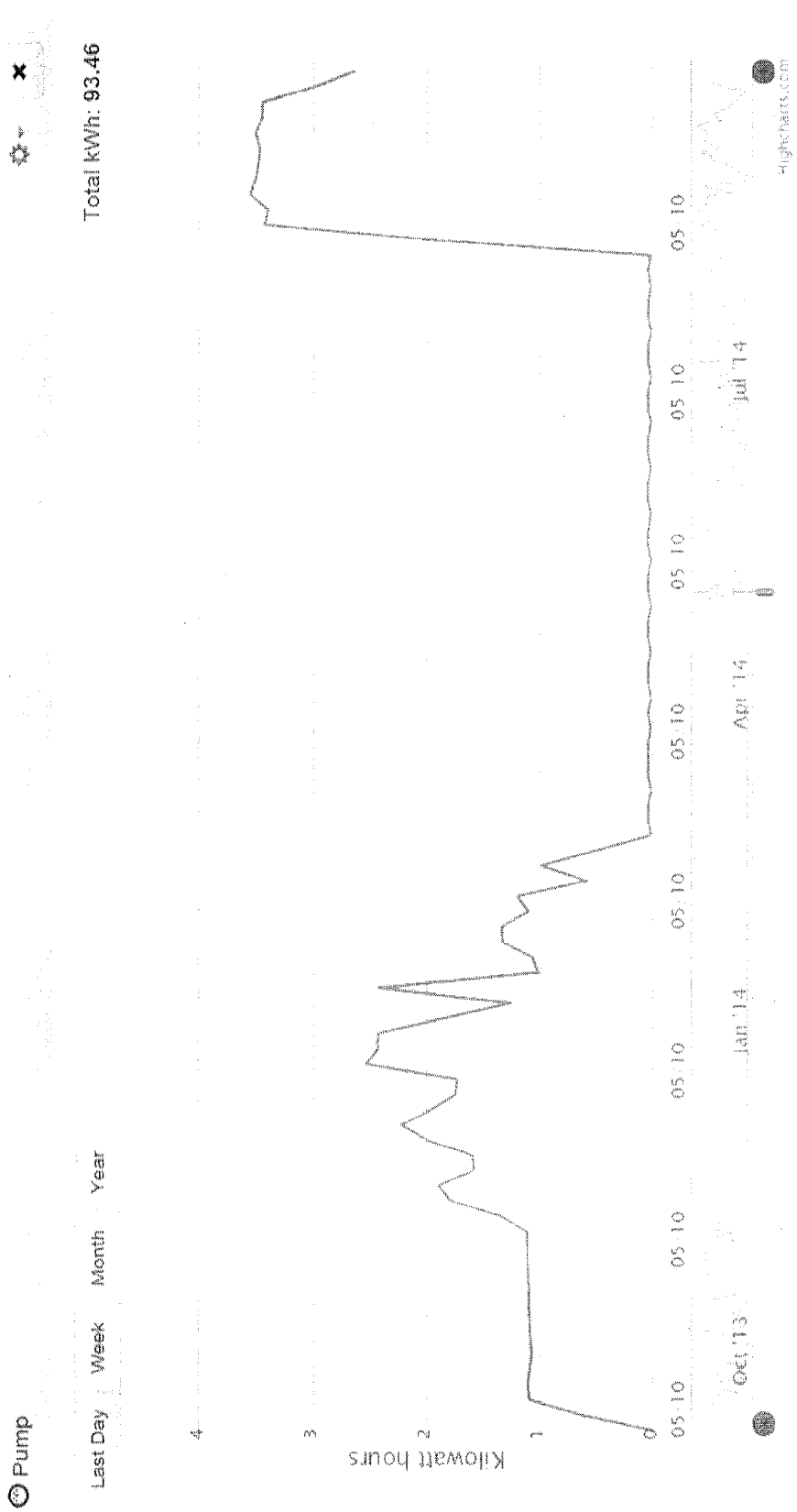
FIG. 7-C

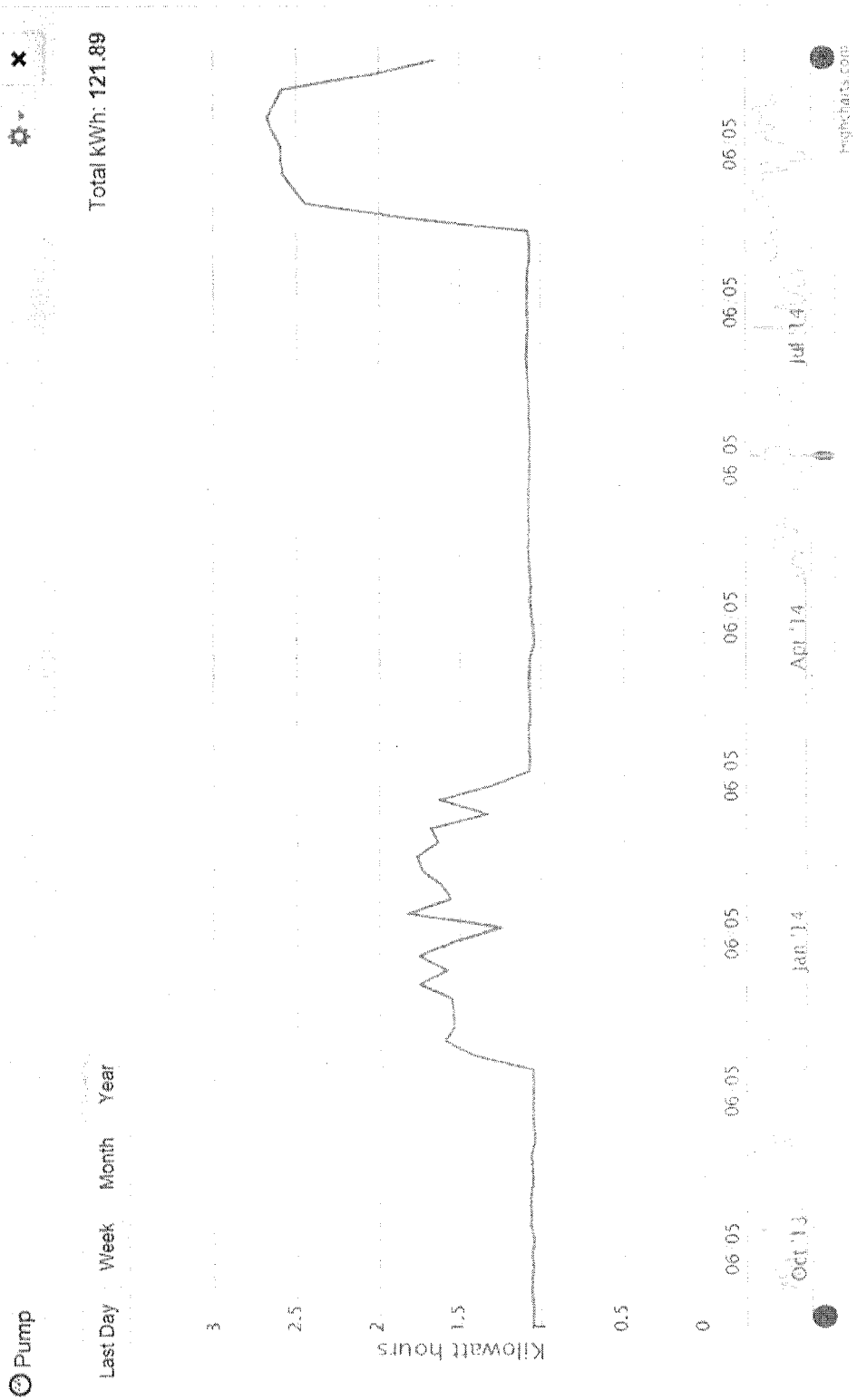
FIG. 7-D

FIG. 7-E

METHODS TO DETECT WATER LEAKS IN IRRIGATION SYSTEMS USING A PUMP ENERGY CONSUMPTION DATA

This application claims the benefit of U.S. Provisional Patent Application Ser. No. 61/888,459 filed Oct. 8, 2013, and is incorporated by reference herein.

FIELD OF THE INVENTION

The present invention relates generally to methods of detecting water leaks in irrigation systems using energy consumption data and providing notifications of said leaks, and systems for implementing said methods.

BACKGROUND OF THE INVENTION

Leaks in irrigation pipes happen often in agriculture. The irrigation system can be damaged by a worker, an animal or a machine. Leaks can also be caused by wear and tear. Leaks are very labor intensive to locate (ranchers have to walk every other row in a large field). They usually go undetected until there is physical damage to a crop or to property, or when an increase in utility bills is observed by the farmer, which may be months after the leak started.

Water pumps are used to distribute the water throughout an irrigation system. Leaks in irrigation pipes change the way the water pumps run, creating a different electrical load profile. This anomalous behavior makes it more difficult to automate the irrigation system by a control system; it also makes the performance of the water pumps less predictable and prevents the effective use of energy management systems. Otherwise energy management systems could be: (1) used to leverage flexibility in the pumps that can be sold to a utility market; or (2) integrated with energy storage systems to use a renewable energy source onsite rather than conventional sources from the grid. See, for example, European patent application publication number EP20120181445 "Methods and apparatus for controlling irrigation systems", and U.S. patent application Ser. No. 13/844,605 "Digital electrical routing control system for use with electrical storage systems and conventional and alternative energy sources."

Currently, water leaks are detected in water distribution networks using a network of hardware sensors and management software—companies such as Aclara, Itron, etc. provide such solutions to water utility companies. However, these solutions are cost prohibitive for customers beyond the utility company's water meter or for farmers who have their own water sources.

For water systems beyond the utility company's water meter, the problem has been typically identified by the appearance of water pools on the property, by pumps running dry, or by seeing significantly larger electrical bills weeks after the leak first begins. In the first two cases, the leaks are severe enough that property damage or equipment damage make the leak apparent. In the third case, the leak is either remotely located so that it wasn't previously noted, or was small enough to not yet have resulted in major damage to property or equipment. In any case, significant costs can be incurred by not quickly identifying leaks. Also, property damage and even catastrophic crop loss can occur resulting in substantial repair costs and loss of income.

There is a need for improved methods of detecting water leaks in water distribution systems generally and in particular in irrigation systems.

SUMMARY OF THE INVENTION

Water leaks in irrigation systems may be detected by analysis of water pump energy consumption data captured from a utility power meter. Unlike existing solutions that use water meters or acoustic sensors, embodiments of the present apparatus and methods described herein detect water leaks based upon the electrical load associated with the water pump(s) in irrigation lines. These methods have the advantage of not requiring any extra hardware at the site of the irrigation system. These methods have the advantage of not requiring any extra hardware at the site of the irrigation system. In embodiments, methods of the present invention are very scalable due to the energy usage data captured from smart meters at the site of the irrigation system and made available through interfaces such as the Energy Service Provider Interface (ESPI) from Green Button that makes energy data available to millions of users and third party applications. See Energy Service Provider Interface at http://openespi.org./, last visited Oct. 4, 2013. Analysis of the energy data is done using an algorithm based on statistical analysis, and has been successfully demonstrated at a pilot site. Furthermore, machine learning programs can further identify where the leak actually occurs by recognition of electrical signatures of a water pump when different parts of an irrigation system are being operated.

Further embodiments of the present invention include systems for the implementation of leak detection and notification methods according to the aforementioned processes.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein:

FIGS. 7A-E shows a schematic of a system and method of electrical signature collection to allow for identification of leaks in different parcels of an irrigated property, according to some embodiments of the present invention and energy signatures associated therewith;

DETAILED DESCRIPTION OF THE PREFERRED EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Furthermore, the present invention encompasses present and future known equivalents to the known components referred to herein by way of illustration.

Figure 1:
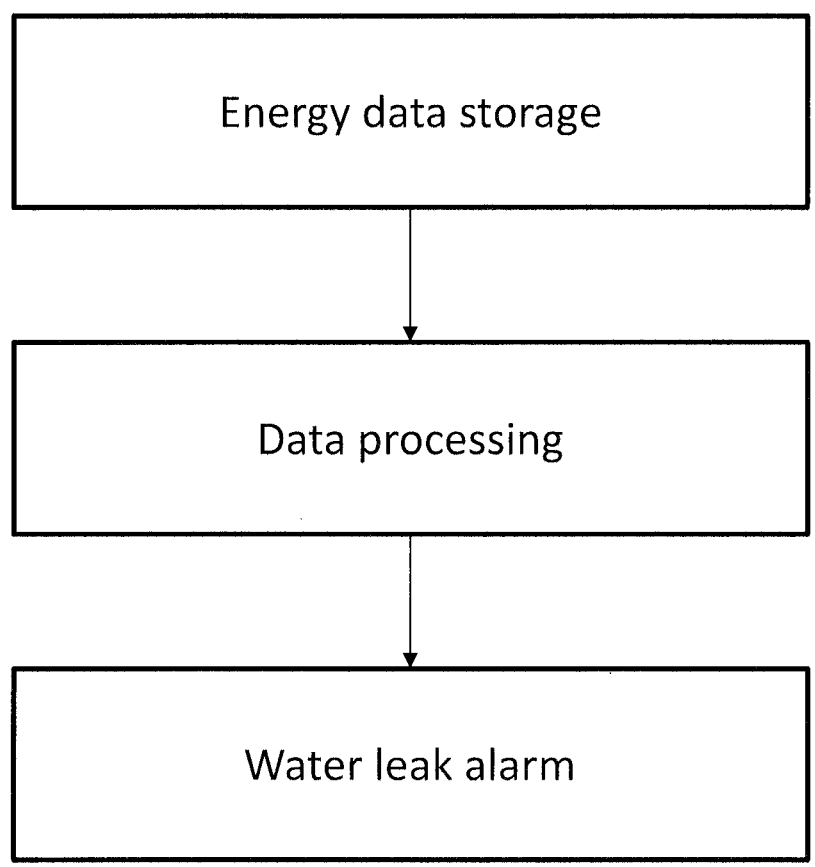
FIG. 1 shows a flow chart of a leak detection and notification method, according to some embodiments of the present invention.

The general method to detect and notify a water leak is described in the flow diagram of FIG. 1. It consists of an energy data capturing step ("energy data storage"), a data processing step ("data processing"), and an alarm signal step where the alarm signal is triggered by a threshold ("water leak alarm").

Figure 2:
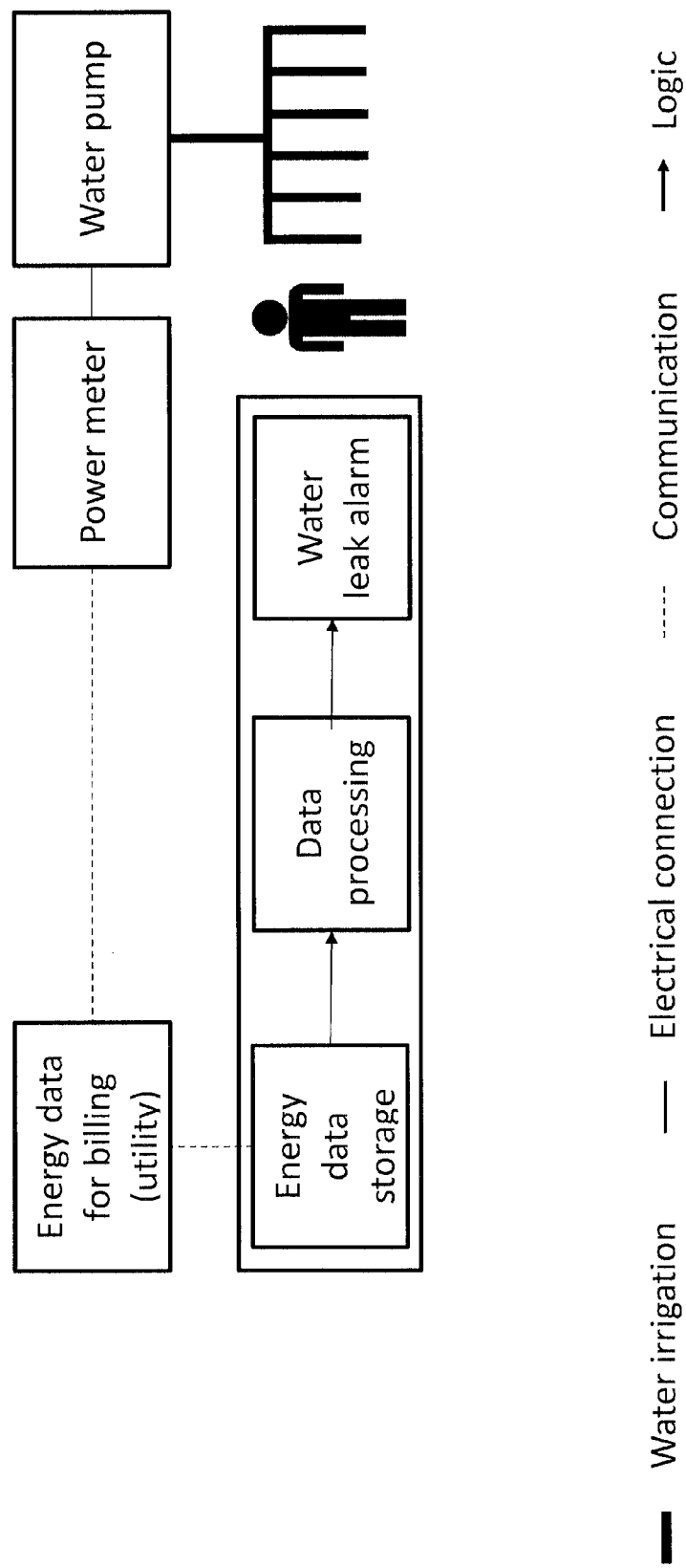
FIG. 2 shows a schematic of a system and method of leak detection and notification according to a first embodiment of the present invention.

In a first embodiment (FIG. 2), the energy data is captured from a smart meter operated by a utility (e.g., PG&E). Utilities use advanced metering infrastructure to automatically collect energy data for billing purposes. The data can be made available to third parties thanks to the Green Button interface. The energy data captured at regular intervals (e.g., 15 minutes) are made available typically once a day. A server can collect the data using a communication network such as the Internet. The energy data is stored in a secure database. In one embodiment, the database is secure to protect the privacy of the user. For example, the user can be a rancher such as a horse breeder or a farmer such as a vine-grower.

Figure 3:
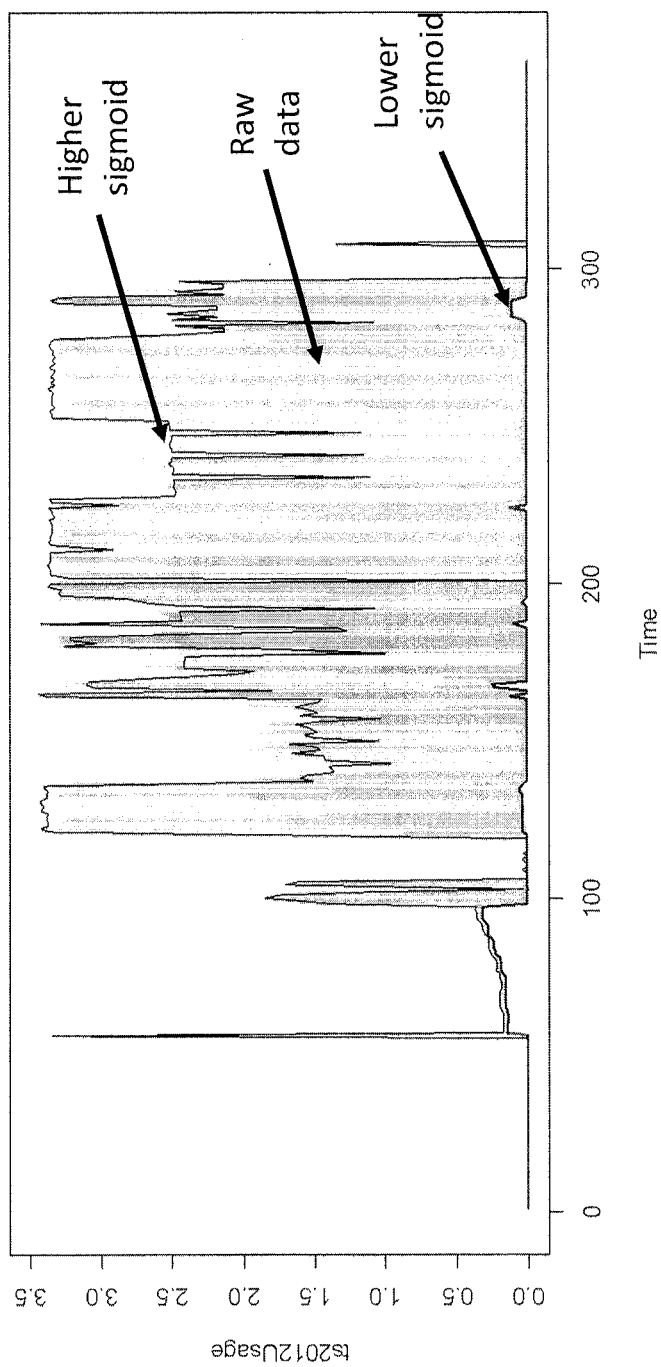
FIG. 3 shows an example of energy data collected for an irrigation pump (energy in kWh as a function of time in days), along with an error signal generated by a PAM algorithm, according to some embodiments of the present invention.

The data is processed using an algorithm. In one implementation, the algorithm is based on statistical data analysis. For the purpose of testing, a Partitioning Around Medoids (PAM) of class 3 algorithm was used. FIG. 3 shows an error signal (lower sigmoid) generated by PAM classification with 3 medoids; the raw energy data is in 15 minute increments over 13 months, with the error signal (lower sigmoid) showing that signature for a leak is to not go back to zero energy consumption when the irrigation cycle is off.

Historical data (e.g., 13 months) can be used to generate one or more thresholds. In one embodiment, only one threshold is used to send an alarm signal to the user. In another embodiment a second lower threshold is used to send a warning message. For the purpose of testing, an emergency alarm is sent via a text message to reach the user on his or her portable phone. In another embodiment, a warning message is sent by email.

Figure 4:
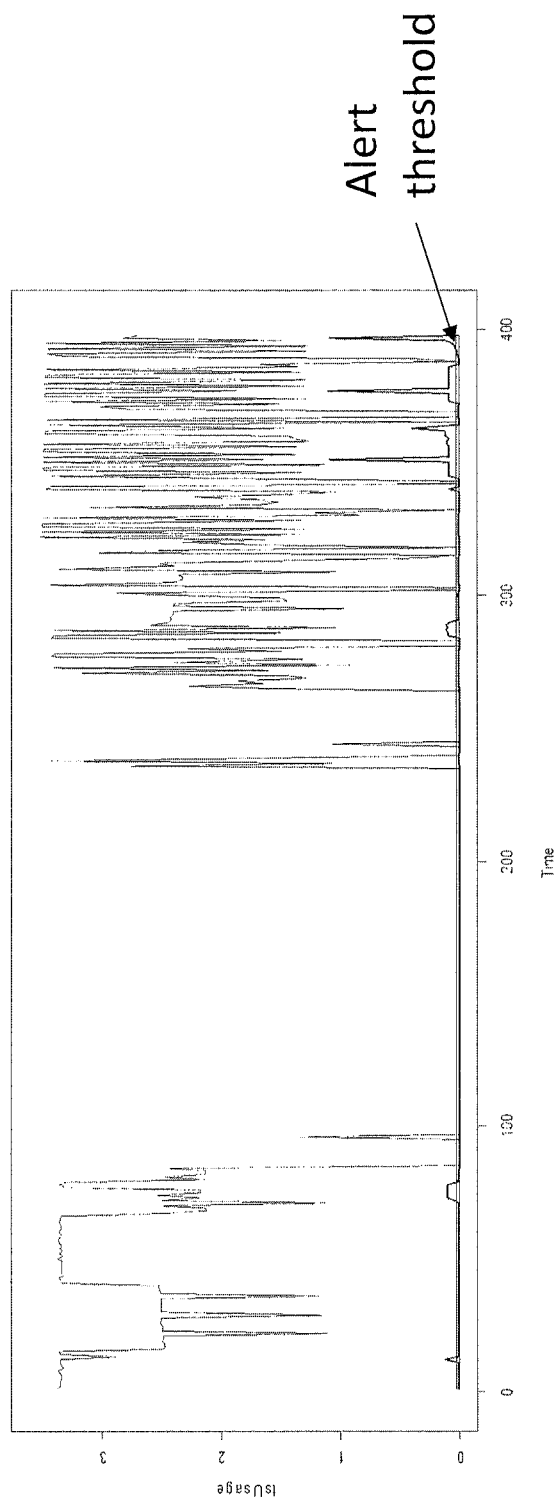
FIG. 4 shows a further example of energy data collected for the irrigation pump of FIG. 3, where the calculated error signal exceeds an alarm threshold generating an alarm, according to some embodiments of the present invention.

The method described above was tested in summer 2013 at a ranch in California. An apparatus was built as described above. A leak was reported in September (FIG. 4)—the error signal went over the alert threshold indicating a leak. The customer validated that the method detected a leak the user did not know about. The user was able to fix the leak, which resulted in thousands of gallons saved and hundreds of kilowatt-hours saved. More importantly, detection of the leak prevented physical damage to the property. A previous leak had flooded a field over time and ruined the property landscape. In some situations a leak can cause damage to crops such as, but not limited to, vines, orchards, and lettuce.

Figure 5:
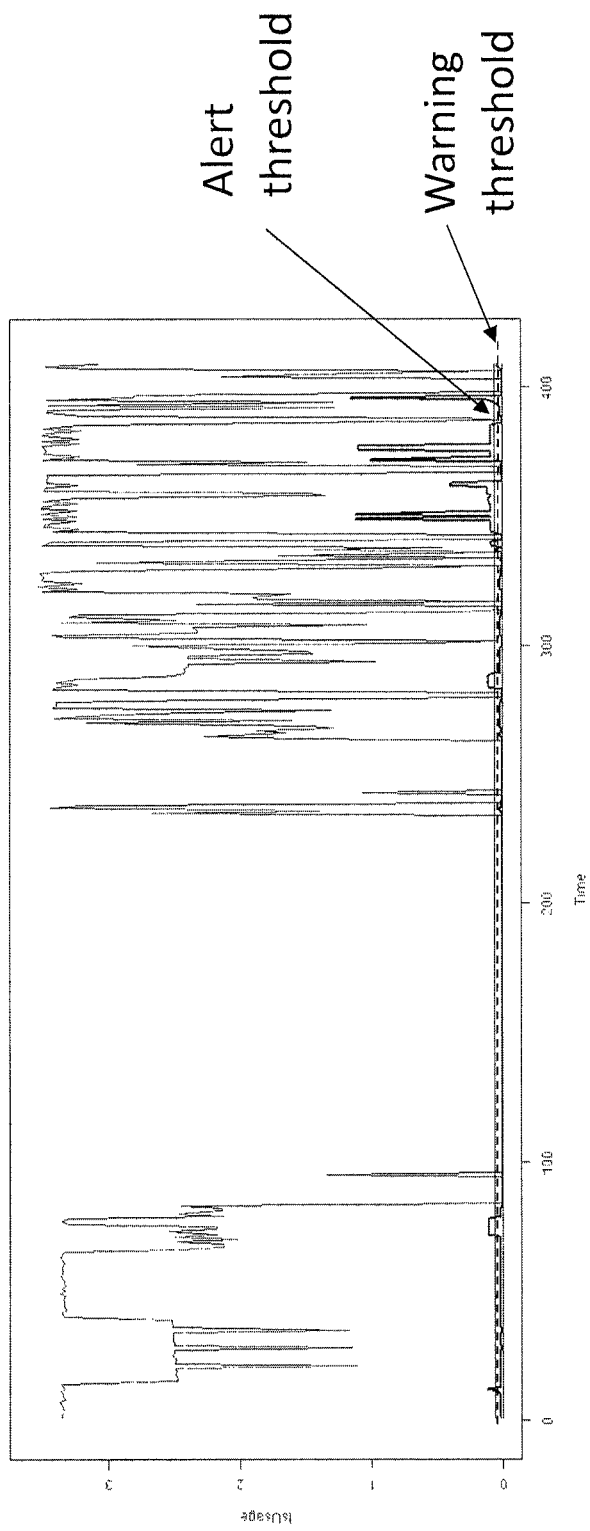
FIG. 5 shows an extension of the energy data of FIG. 4 by a few days, where the calculated error signal exceeds a warning threshold generating a warning, according to some embodiments of the present invention.

It has been found that the error signal tends to creep up (slowly increase) before a significant leak occurs. A warning threshold can be set at a fraction (a third, or other fraction, for example) of the alert threshold to bring attention to a developing leak. In one instance, a leak was predicted three days before it actually happened using this technique. For example, later in September, the statistical indicator (lower sigmoid) increased again and reached the warning threshold (FIG. 5). A warning email was sent predicting a leak. A few days later, the statistical indicator reached the alert threshold (FIG. 5) indicating a leak. An alarm text message was sent to the user of the irrigation system.

Figure 6:
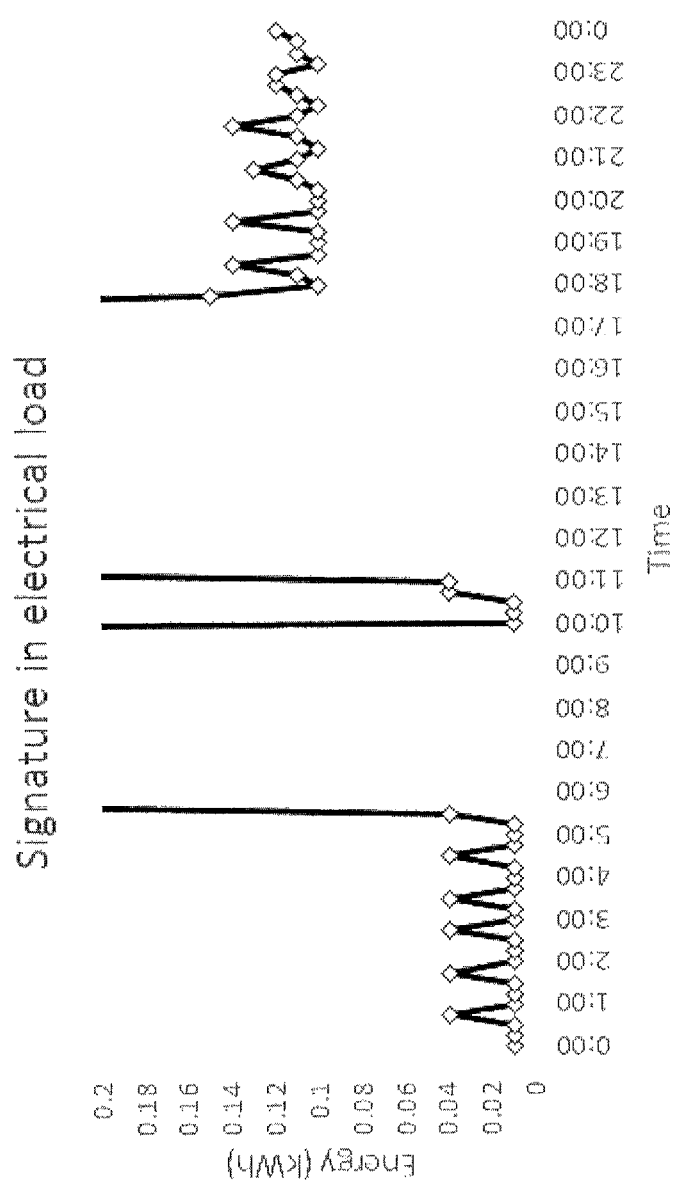
FIG. 6 shows an example of a unique electrical signature associated with a leak in a particular part of the irrigation system, according to some embodiments of the present invention.

The method described above can be enhanced to not only detect when a leak occurs but also where it is located. This can save many man-hours looking for the leak on a large field. Various leaks create different signatures in the electrical load (FIG. 6 shows electrical signatures before a catastrophic leak). The signatures can be recognized by machine learning algorithms provided with data sets that assign signatures to various parcels on the property. The assignment of signatures to different parcels on a property can be done in a training process such as shown in FIGS. 7A-7E, with FIG. 7B-7E illustrating how the different signatures, as described above, are used to determine location. FIG. 7A shows the overview of the system. FIG. 7B illustrates the energy load profile for a pump connected to two parcels: one parcel is irrigated in the morning, one in the evening. In the load profile shown in FIG. 7C, there is a leak on the first parcel. In the load profile shown in FIG. 7D, there is a leak on the second parcel. In the load profile shown in FIG. 7E, a leak on the second parcel was fixed but there is still one on the first parcel.

Figure 9:
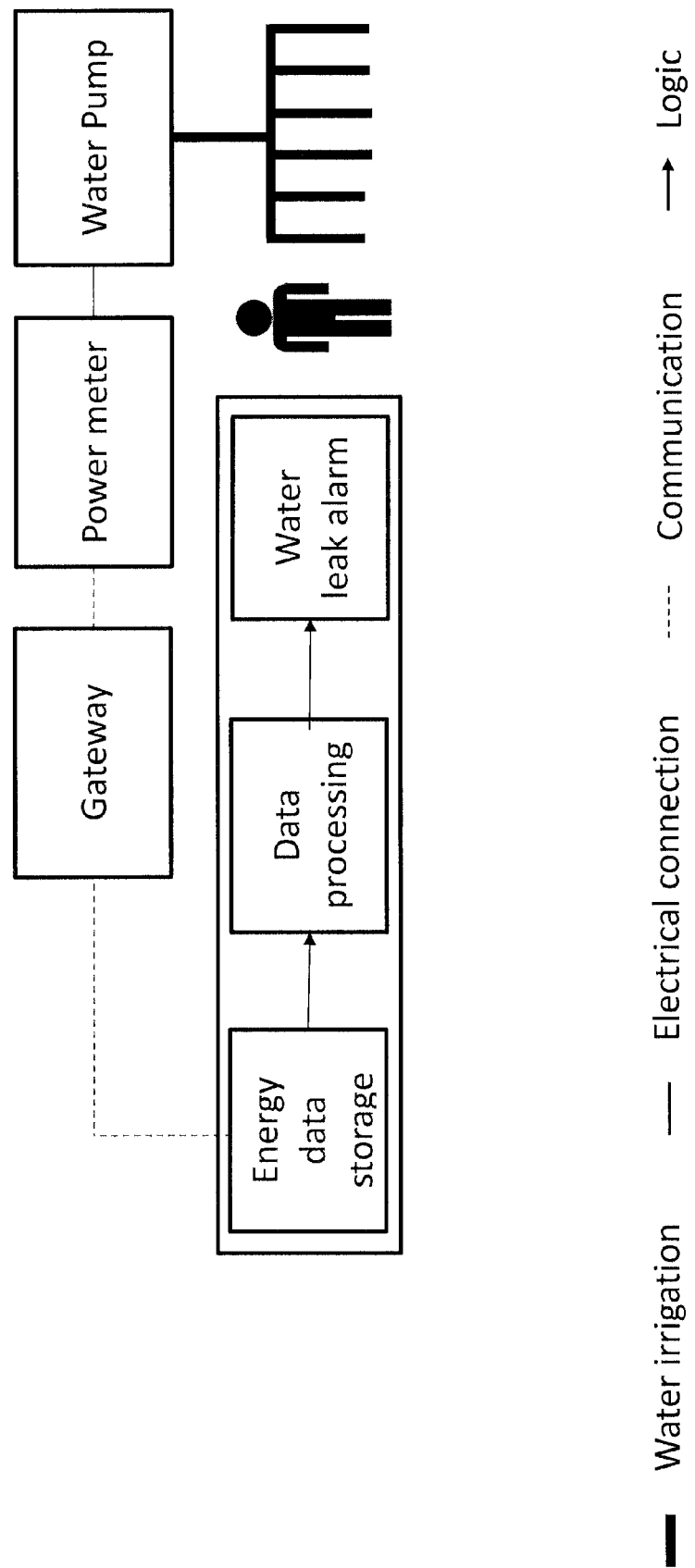
FIG. 9 shows a schematic of a system and method of leak detection and notification with multiple electrical devices attached to the power meter, according to some embodiments of the present invention.

In another embodiment, a gateway is collocated with the meter, as shown in FIG. 9, to capture finer-grained data at shorter intervals (e.g., 1 minute). The Device 2, Device n, etc. in FIG. 9 are other electrical devices such as another water pump, an HVAC system, a refrigerator, a lighting system, or any other appliance, which complicate the energy data collected, such that filtering is required. The data is captured by a server using a communication network. The finer-grained data can be used to detect the leak in a real-time rather than within a 24-hour period. The finer-grained data provides more detailed electrical signatures that can be used to identify the location of the leak more accurately.

Figure 8:
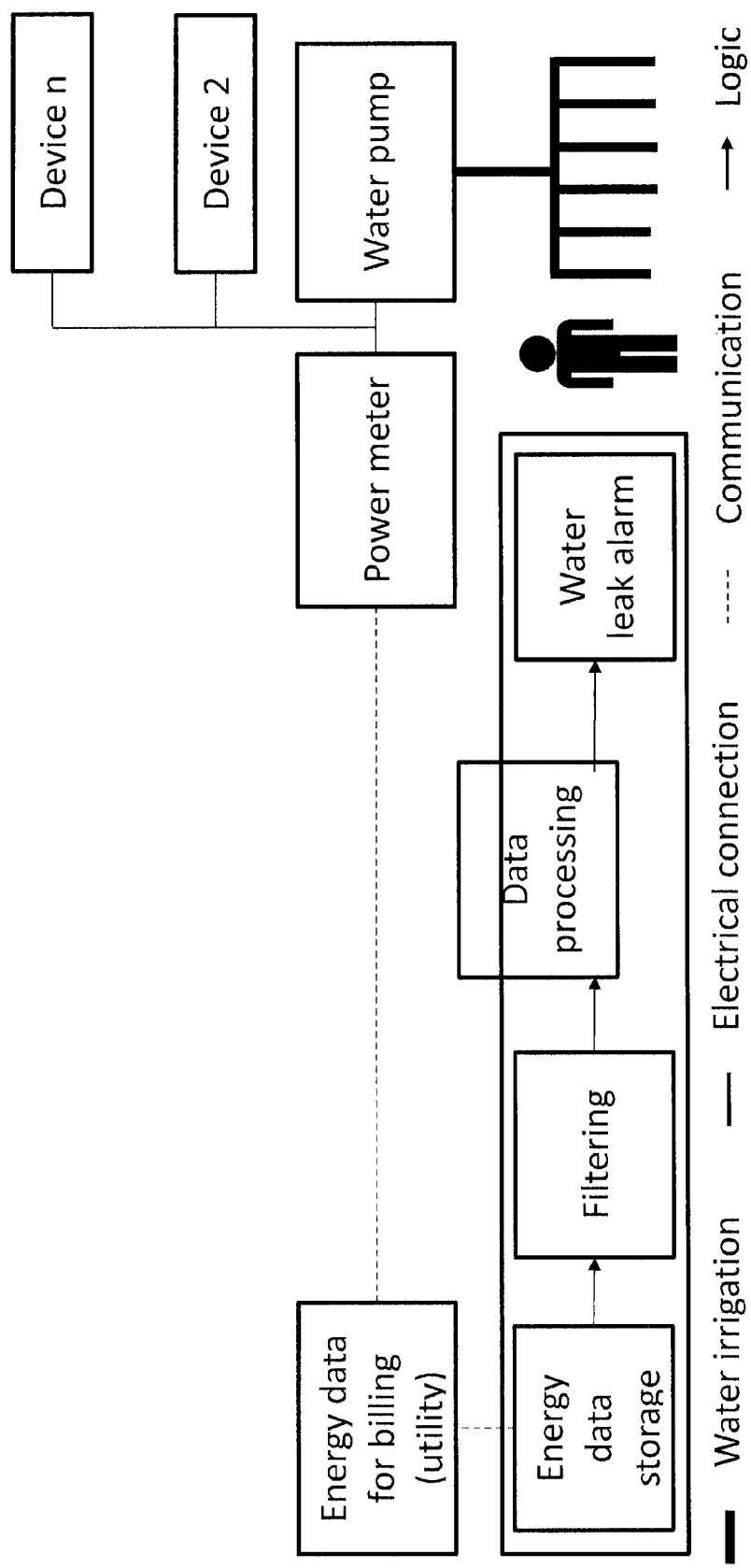
FIG. 8 shows a schematic of a system and method of leak detection and notification with a finer-grained data collection capability and filtering, according to some embodiments of the present invention.

In yet another embodiment, more than one electrical device is attached to the meter (FIG. 8). The energy data related to the water pump is extracted using a filter. The method described above is used to process the extracted data and to generate an alarm when a leak is detected (FIG. 8).

Figure 10:
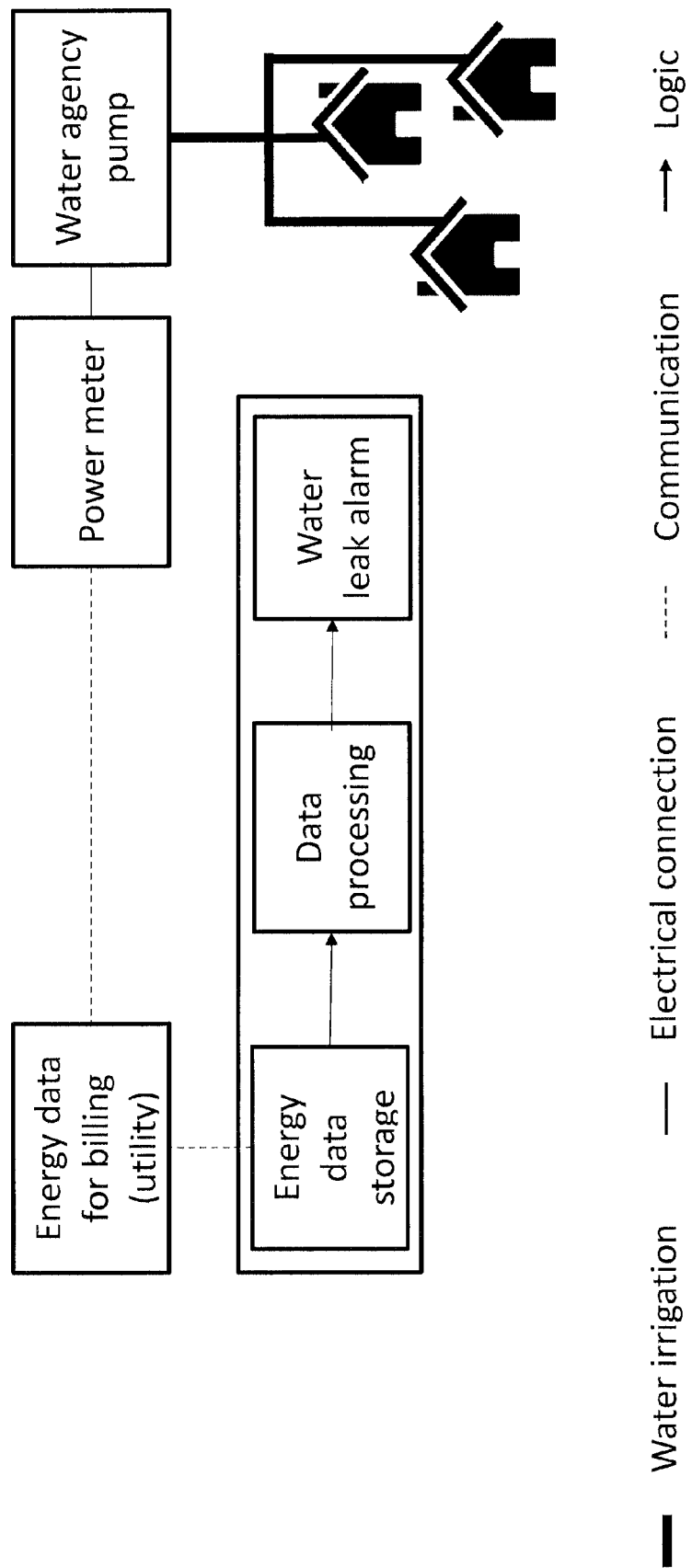
FIG. 10 shows a schematic of a system and method of leak detection and notification for a water distribution system for homes, according to some embodiments of the present invention.

The method herein can be generalized to a water distribution system where a large pump distributes water to various homes, as shown in FIG. 10. It has not been demonstrated, but a leak at a home will generate changes in the pumping system. However, it remains to be tested that the response in electrical load is large enough to be detected reliably by a data mining algorithm.

Figure 11:
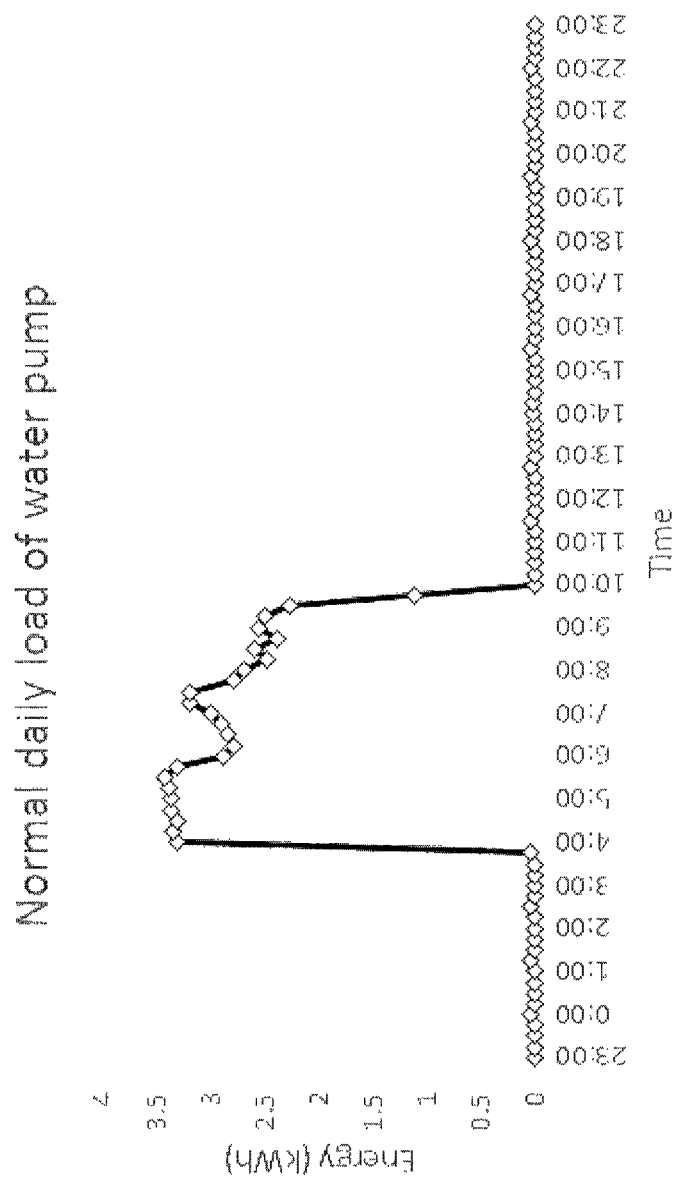
FIG. 11 shows an example of a normal daily electrical load for a water pump, the data being collected according to some embodiments of the present invention.
Figure 12:
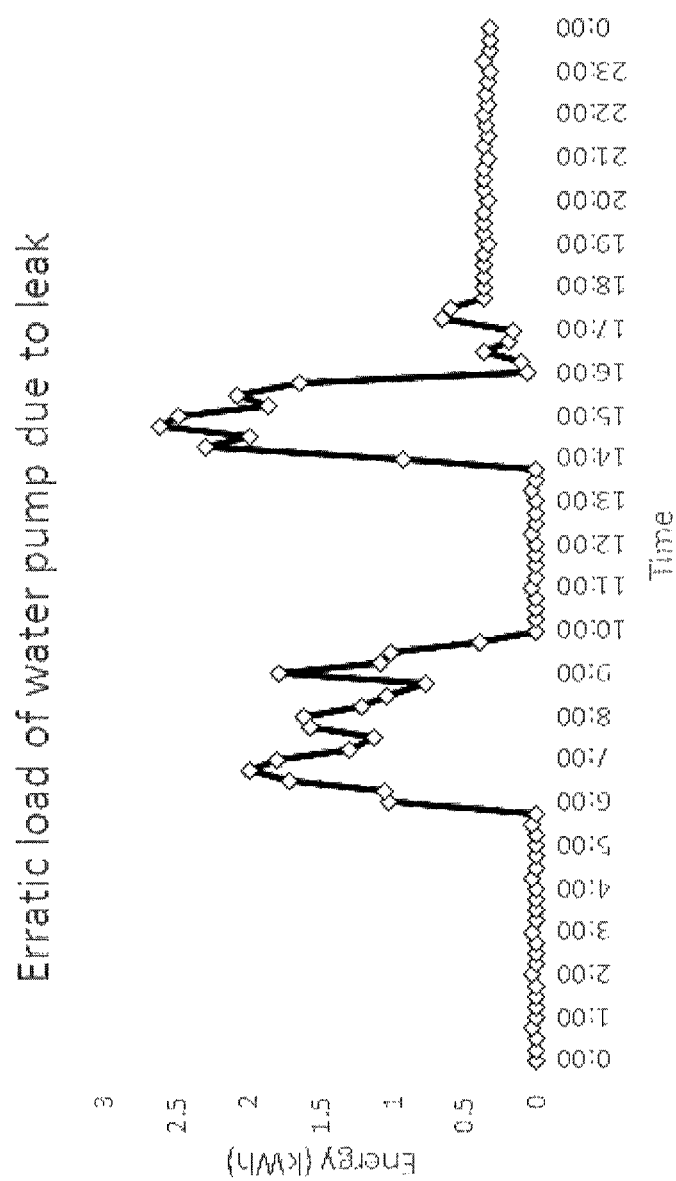
FIG. 12 shows an example of an erratic electrical load for a water pump due to an irrigation leak, the data being collected according to some embodiments of the present invention.

Finally, the method described herein can be used to remove anomalies in the way water pumps are run. This is particularly useful to automate irrigation from historical patterns. If not caught early using the method described above, leaks can create significant changes in the electrical load over time, which prevents predictable and repeatable automation. A normal load was captured for one test site (FIG. 11). An abnormal load was captured during a long-term leak (FIG. 12).

Although the present invention has been particularly described with reference to the preferred embodiments thereof, it should be readily apparent to those of ordinary skill in the art that changes and modifications in the form and details may be made without departing from the spirit and scope of the invention.

What is claimed is:

1. An apparatus for determining a water leak within an irrigation system that includes an electrical water pump that operates using electrical energy and which is connected to an energy meter that periodically provides for a previous period of time energy usage data for the previous period of time, the apparatus comprising:
   a database that receives and stores the energy usage data associated with the irrigation system for the previous period of time; and
   a data processing computer system coupled to the database that operates upon the energy usage data that includes the electrical energy used to operate the electrical water pump within the irrigation system, wherein the data processing computer system:
   obtains at least one threshold indicative of a water leak within the irrigation system;
   detects the presence of the water leak by finding the at least one threshold was exceeded within the energy usage data associated with the irrigation system for the previous period of time; and
   upon detection of the presence of the water leak associated with the irrigation system for the previous period of time, automatically generates an alert associated therewith.

2. The apparatus according to claim 1 wherein the data processing computer system finds the at least one threshold was exceeded within the energy usage data associated with the irrigation system for the previous period of time by:
   detecting an error signal within the energy usage data associated with the irrigation system for the previous period; and
   comparing the error signal to the at least one threshold.

3. The apparatus according to claim 2 wherein the data processing computer system obtains the at least one threshold based upon a statistical data analysis of the energy usage data associated with the irrigation system for a plurality of historical previous periods of times.

4. The apparatus according to claim 3 wherein the data processing computer system obtains the error signal based upon a Partitioning-Around-Medoid (PAM) algorithm for the previous period of time.

5. The apparatus according to claim 4 wherein the previous period of time is at least a 24 hour period and wherein the historical previous period of time is at least one year.

6. The apparatus according to claim 4 wherein the previous period of time is at least a one hour period and the historical previous period of time is at least a 24 hour period.

7. The apparatus according to claim 4 wherein the previous period of time is a one minute period.

8. The apparatus according to claim 1 wherein the previous period of time is at least a 24 hour period.

9. The apparatus according to claim 1 wherein:
   the data processing computer system further obtains another threshold indicative of a potential future water leak within the irrigation system;
   detects the presence of the potential future water leak by finding the another threshold is exceeded within the energy usage data associated with the irrigation system for the previous period of time; and
   upon detection of the presence of the potential future water leak, automatically generates a warning message associated therewith.

10. The apparatus according to claim 9 wherein:
    the data processing computer system finds the at least one threshold was exceeded within the energy usage data associated with the irrigation system for the previous period of time by:
       detecting an error signal within the energy usage data associated with the irrigation system for the previous period;
       comparing the error signal to the at least one threshold; and
    the data processing computer system finds the another threshold was exceeded within the energy usage data associated with the irrigation system for the previous period of time by:
       detecting another error signal within the energy usage data associated with the irrigation system for the previous period;
       comparing the another error signal to the another threshold.

11. The apparatus according to claim 10 wherein the data processing computer system obtains the at least one threshold and the another alert threshold based upon a statistical data analysis of the energy usage data associated with the irrigation system for a plurality of historical previous periods of times.

12. The apparatus according to claim 11 wherein the data processing computer system obtains the error signal and the another error signal based upon a Partitioning-Around-Medoid (PAM) algorithm for the previous period of time.

13. The apparatus according to claim 12 wherein the previous period of time is at least a 24 hour period and wherein the historical previous period of time is at least one year.

14. The apparatus according to claim 1 wherein the data processing computer system, when detecting the presence of the water leak from the energy usage data, also filters from the energy usage data energy data related to electrical devices other than the at least one electrical water pump to extract energy data associated with the at least one electrical water pump.

15. The apparatus according to claim 1 wherein the data processing computer system, when detecting the presence of the water leak from the energy usage data, uses for detection of the water leak a signature in which energy consumption does not go back to zero when the water pump is turned off at an end of an irrigation cycle.

16. An apparatus for determining a water leak location within an irrigation system that services a plurality of parcels that are each connected at different times to one electrical water pump that operates using electrical energy and which is connected to one energy meter that periodically provides for a previous period of time energy usage data for the previous period of time that also includes the different times, the apparatus comprising:
- a database that receives and stores the energy usage data associated with the irrigation system for the previous period of time; and
- a data processing computer system coupled to the database that operates upon the energy usage data that includes the electrical energy used to operate the electrical water pump within the irrigation system, wherein the data processing computer system:
  - obtains a threshold indicative of a water leak within the irrigation system for each of the plurality of parcels;
  - detects the water leak location by finding which threshold for each of the plurality of parcels has been exceeded within the energy usage data for the previous period of time; and
  - upon detection of the the water leak location, automatically generating an alert associated therewith.

17. The apparatus according to claim 15 wherein the data processing computer system identifies the different parcels associated with the irrigation system using electrical signatures that are different for each parcel.

18. The apparatus according to claim 16 wherein the different electrical signature are generated by statistical data analysis of a plurality of historical periods of time.

19. A method for determining a water leak within an irrigation system that includes at least one electrical water pump that operates using electrical energy and which is connected to an energy meter that periodically provides for a previous period of time energy usage data for the previous period of time, the method comprising:
- receiving and storing the energy usage data associated with the irrigation system for the previous period of time in a database;
- obtaining, at a data processing computer system coupled to the database that operates upon the energy usage data that includes the electrical energy used to operate the electrical water pump within the irrigation system, at least one threshold signal indicative of a water leak within the irrigation system;
- detecting, using the data processing computer system, the presence of the water leak by finding the at least one alert threshold was exceeded within the energy usage data associated with the irrigation system for the previous period of time; and
- upon detecting the presence of the water leak associated with the irrigation system for the previous period of time, using the data processing computer system to automatically generate an alert associated therewith.

20. The method according to claim 19 wherein the data processing computer system, when detecting the presence of the water leak from the energy usage data, uses for detection of the water leak a signature in which energy consumption does not go back to zero when the water pump is turned off at an end of an irrigation cycle.

* * * * *